(12) United States Patent
Han

(10) Patent No.: US 8,941,434 B1
(45) Date of Patent: Jan. 27, 2015

(54) BUS ENCODING SCHEME BASED ON NON-UNIFORM DISTRIBUTION OF POWER DELIVERY NETWORK COMPONENTS AMONG I/O CIRCUITS

(71) Applicant: Samsung Display Co., Ltd., Yongin (KR)

(72) Inventor: Minghui Han, San Jose, CA (US)

(73) Assignee: Samsung Display Co., Ltd., Yongin (KR)

(*) Notice: Subject to any disclaimer, the term of this patent is extended or adjusted under 35 U.S.C. 154(b) by 0 days.

(21) Appl. No.: 14/174,720

(22) Filed: Feb. 6, 2014

Related U.S. Application Data

(60) Provisional application No. 61/845,871, filed on Jul. 12, 2013.

(51) Int. Cl.
*H03K 3/00* (2006.01)

(52) U.S. Cl.
USPC .......................... 327/384; 327/108; 361/763

(58) Field of Classification Search
USPC .................................. 327/108, 384; 361/763
See application file for complete search history.

(56) References Cited

U.S. PATENT DOCUMENTS

| | | | |
|---|---|---|---|
| 6,628,138 B2 * | 9/2003 | Bobba et al. ............... | 326/21 |
| 6,653,857 B2 * | 11/2003 | Bobba et al. ............... | 326/21 |
| 6,693,842 B2 * | 2/2004 | Chung et al. ............ | 365/230.06 |
| 7,600,208 B1 * | 10/2009 | Sharma et al. ............... | 716/120 |
| 7,719,310 B2 * | 5/2010 | Yokoi et al. ............... | 326/33 |
| 7,778,038 B2 * | 8/2010 | McGregor et al. ........... | 361/763 |
| 7,800,151 B2 * | 9/2010 | Mizushino et al. ........... | 257/300 |
| 7,825,692 B2 * | 11/2010 | Kim ............... | 326/83 |
| 7,923,755 B2 * | 4/2011 | Mizushino et al. ........... | 257/200 |
| 8,122,418 B2 * | 2/2012 | Uchida ............... | 716/122 |
| 8,332,790 B1 * | 12/2012 | Oishei et al. ............... | 716/111 |
| 8,482,323 B2 * | 7/2013 | Eimitsu et al. ............... | 327/112 |
| 8,610,188 B2 * | 12/2013 | Kerber et al. ............... | 257/296 |
| 2001/0004227 A1 | 6/2001 | Frech et al. | |
| 2010/0052765 A1 | 3/2010 | Makino | |
| 2012/0229310 A1 | 9/2012 | Chang | |

FOREIGN PATENT DOCUMENTS

| | | |
|---|---|---|
| KR | 10-2005-0120174 A | 12/2005 |
| KR | 10-2006-0041455 A | 5/2006 |
| KR | 10-2010-00084379 A | 7/2010 |

OTHER PUBLICATIONS

European Search Report; Application Serial No. 14171820.5, dated Nov. 28, 2014, 5 sheets.

* cited by examiner

*Primary Examiner* — Kenneth B. Wells
(74) *Attorney, Agent, or Firm* — Christie, Parker & Hale, LLP

(57) ABSTRACT

A system and method for reducing simultaneous switching output (SSO) noise. In one embodiment, power supply decoupling capacitances are distributed non-uniformly among a plurality of I/O circuits. Transitions between consecutive values on a data bus are either sent by the transmitter as requested at the input of the transmitter, or, in cases for which the noise of the requested transition is high, converted by an encoder to transitions having lower SSO noise. The converted transitions are decoded in a receiver, so that the data at the output of the receiver are the same as the data at the input to the transmitter.

20 Claims, 6 Drawing Sheets

| Bus event before encoding | SSO Noise (Normalized) | Bus event after encoding | SSO Noise (Normalized) |
|---|---|---|---|
| 11 | A | 2.19 | 00 | 0.0 |
| 10 | A | 1.51 | 01 | 0.68 |
| 01 | B | 0.68 | 01 | 0.68 |
| 00 | B | 0.0 | 00 | 0.0 |

FIG. 3A

| Bus event before encoding | SSO Noise (Normalized) | Bus event after encoding | SSO Noise (Normalized) |
|---|---|---|---|
| 11 | A | 2.0 | 00 | 0.0 |
| 10 | B | 1.0 | 10 | 1.0 |
| 01 | B | 1.0 | 01 | 1.0 |
| 00 | B | 0.0 | 00 | 0.0 |

FIG. 3B

RELATED ART

| Requested Transition | | SSO Noise (Normalized) | Converted Transition | SSO Noise (Normalized) |
|---|---|---|---|---|
| 1111 | A | 1.9 | 0000 | 0.0 |
| 1110 | A | 1.51 | 0001 | 0.39 |
| 1101 | A | 1.51 | 0010 | 0.39 |
| 1011 | A | 1.51 | 0100 | 0.39 |
| 0111 | A | 1.17 | 1000 | 0.73 |
| 1010 | A | 1.12 | 0110 | 0.78 |
| 1001 | A | 1.12 | 0101 | 0.78 |
| 1100 | A | 1.12 | 0011 | 0.78 |

FIG. 4

BUS ENCODING SCHEME BASED ON NON-UNIFORM DISTRIBUTION OF POWER DELIVERY NETWORK COMPONENTS AMONG I/O CIRCUITS

CROSS-REFERENCE TO RELATED APPLICATION(S)

The present application claims priority to and the benefit of Provisional Application No. 61/845,871, filed Jul. 12, 2013, entitled "BUS ENCODING SCHEME BASED NON-UNIFORM DISTRIBUTION OF POWER DELIVERY NETWORK COMPONENTS AMONG I/O CIRCUITS", the entire content of which is incorporated herein by reference.

FIELD

The following description relates to the transmission of data on a bus, and more particularly to a system and method for transmitting data with reduced simultaneous switching output (SSO) noise.

BACKGROUND

Buses carrying digital data on multiple parallel data lines may be used in numerous applications, e.g., for connecting integrated circuits to each other or for connecting printed wiring boards. In such an application, a transmitter for sending data on a bus may have a plurality of input/output (I/O) circuits, one per data line, each switching the voltage on the data line between two values. For example, if a data line is implemented as a single conductor and a ground, e.g., as a printed wiring board (PWB) trace over a ground plane, an I/O circuit may drive the conductor with a positive voltage to signal a logical 1 (i.e., high), or with a voltage near ground to signal a logical 0 (i.e., low). In other examples, a data line may include more than one conductor in addition to, or without, a ground conductor. For example, differential signaling may be used with two conductive traces, a first trace and a second trace, over a ground plane on a PWB, and the I/O circuit may drive the first trace and the second trace in a complementary manner, so that, e.g., at any point in time, the current carried by the second trace is substantially equal in magnitude as the current carried by the first trace, and in the opposite direction.

The I/O circuit may draw relatively high current from the power supply when it is transitioning between states, e.g., from a logical 1 to a logical 0, or vice versa. This current draw may cause a fluctuation in the higher power supply voltage (VDD) or the lower ground voltage (VSS) or both. The fluctuation in VDD may differ in magnitude from the fluctuation in VSS. For example, if a PWB trace is used to provide VDD and a ground plane is used to provide VSS, in which case the source impedance of VDD may be greater than that of VSS, and the change in voltage resulting from an increased current draw may primarily affect VDD.

In a synchronous system, on a bus with multiple parallel lines, several I/O circuits may, on occasion, switch simultaneously, exacerbating the fluctuations in VDD and/or VSS. This effect is referred to as simultaneous switching output (SSO) noise. The magnitude of SSO noise may be reduced by installing power supply decoupling capacitances, each of which may be composed of a single capacitor or of several capacitors connected in parallel, or by increasing the number or size of the capacitors of which the power supply decoupling capacitances are composed. In some implementations, however, the space area available on the silicon, or in the package, or on the PWB for such capacitors may be limited, constraining the extent to which this mitigation technique may be used.

SSO noise may limit an I/O interface's electrical performance, e.g., it may limit the speed at which the I/O interface may be operated. Thus, there is a need for a system and method for reducing SSO noise.

SUMMARY

In one embodiment, power supply decoupling capacitances are distributed non-uniformly among a plurality of I/O circuits in a transmitter transmitting data on a bus. Transitions between consecutive values on a data bus are sent by the transmitter either as requested at the input of the transmitter, or, in cases for which the noise of the requested transition is high, converted by an encoder to transitions having lower SSO noise. The converted transitions are decoded in a receiver, so that the data at the output of the receiver are the same as the data at the input to the transmitter.

According to an embodiment of the present invention there is provided a system for transmitting data with reduced simultaneous switching output (SSO) noise, the system including: an encoder including a plurality of encoder inputs and a status output, the encoder inputs configured to operate in a plurality of input states, and to transition between the input states of the plurality of input states by a plurality of state transitions; and a plurality of input/output (I/O) circuits controlled by the encoder, the plurality of I/O circuits configured to operate in a plurality of I/O states, and to transition between I/O states of the plurality of I/O states by the plurality of state transitions; each I/O circuit of the plurality of I/O circuits associated with a power supply decoupling capacitance of a plurality of power supply decoupling capacitances, the decoupling capacitance of a first one of the plurality of I/O circuits being substantially smaller than the decoupling capacitance of a second one of the plurality of I/O circuits, each of the plurality of state transitions corresponding to a level of SSO noise when executed by the plurality of I/O circuits, the level of SSO noise of a first subset of the plurality of state transitions being lower than the level of SSO noise of a second subset of the plurality of state transitions; the encoder configured to: receive a requested transition of the plurality of state transitions at the plurality of encoder inputs; cause the I/O circuits to perform the requested transition and disable the status output when the requested transition is one of the first subset of the plurality of state transitions; and cause the I/O circuits to perform a converted transition different from the requested transition and enable the status output when the requested transition is one of the second subset of the plurality of state transitions, the converted transition being one of the first subset of the plurality of state transitions.

In one embodiment, the converted transition is the inverse of the requested transition.

In one embodiment, the encoder has 2 encoder inputs and the system has 2 I/O circuits.

In one embodiment, the decoupling capacitance of the first one of the plurality of I/O circuits is substantially smaller than the decoupling capacitances of the others of the plurality of I/O circuits.

In one embodiment, the first one of the plurality of I/O circuits corresponds to the most significant bit of a data bus.

In one embodiment, the first subset of the plurality of transitions includes transitions in which the first one of the plurality of I/O circuits does not change state.

In one embodiment, the second subset of the plurality of transitions contains only: the set of transitions in which the first one of the plurality of I/O circuits changes state and at least one other I/O circuit changes state, and the transition in which the first one of the plurality of I/O circuits does not change state and all of the other I/O circuits change state.

In one embodiment, the system includes a receiver configured to be operatively coupled to the plurality of I/O circuits, the receiver including: a plurality of receiver inputs, each of the plurality of receiver inputs corresponding to, and configured to receive a signal from, one of the plurality of I/O circuits; and a status input operatively coupled to the status output.

In one embodiment, the receiver includes: a plurality of receiver outputs, each of the plurality of receiver outputs corresponding to one of the plurality of receiver inputs; and a decoder, the decoder configured to cause the receiver outputs to perform the requested transition when the plurality of receiver inputs receive a plurality of signals from the plurality of I/O circuits.

In one embodiment, the decoder is configured to: receive a received transition at the plurality of receiver inputs; receive, at the status input, an enable signal or a disable signal; cause the receiver outputs to perform the received transition when the status input receives a disable signal; and cause the receiver outputs to perform an alternate transition different from the received transition when the status input receives an enable signal, the alternate transition being selected to reverse a mapping, implemented in the encoder, from the requested transition to the converted transition.

According to an embodiment of the present invention there is provided a method for transmitting data in a system including a plurality of I/O circuits, each I/O circuit of the plurality of I/O circuits associated with a power supply decoupling capacitance, the decoupling capacitance of a first one of the plurality of I/O circuits being substantially smaller than the decoupling capacitance of a second one of the plurality of I/O circuits, the method including: receiving a requested transition corresponding to a requested change in states of the I/O circuits; classifying the requested transition as being a member of: a first subset of a plurality of possible state transitions between states of the plurality of I/O circuits; or a second subset of a plurality of possible state transitions between states of the plurality of I/O circuits, the state transitions of the first subset of the plurality of possible state transitions having a lower level of SSO noise than the state transitions of the second subset of the plurality of possible state transitions, causing the I/O circuits to perform the requested transition and disabling a status output when the requested transition is one of the first subset of the plurality of state transitions; and causing the I/O circuits to perform a converted transition different from the requested transition and enabling the status output when the requested transition is one of the second subset of the plurality of state transitions, the converted transition being one of the first subset of the plurality of state transitions.

In one embodiment, the converted transition is the inverse of the requested transition.

In one embodiment, the system has 4 I/O circuits.

In one embodiment, the decoupling capacitance of the first one of the plurality of I/O circuits is substantially smaller than the decoupling capacitance of the others of the plurality of I/O circuits.

In one embodiment, the first one of the plurality of I/O circuits corresponds to the most significant bit of a data bus.

In one embodiment, the second subset of the plurality of state transitions is the set of state transitions in which the first one of the plurality of I/O circuits changes state.

In one embodiment, the second subset of the plurality of state transitions contains only: the set of state transitions in which the first one of the plurality of I/O circuits changes state and at least one other I/O circuit changes state, and the state transition in which the first one of the plurality of I/O circuits does not change state and all of the other I/O circuits change state.

According to an embodiment of the present invention there is provided a system for transmitting data with reduced simultaneous switching output (SSO) noise, the system including: an encoder including a plurality of encoder inputs and a status output, the encoder inputs configured to operate in a plurality of input states, and to transition between the input states of the plurality of input states by a plurality of state transitions; and a plurality of input/output (I/O) circuits controlled by the encoder, the plurality of I/O circuits configured to operate in a plurality of I/O states, and to transition between I/O states of the plurality of I/O states by the plurality of state transitions; each I/O circuit of the plurality of I/O circuits associated with a power delivery network component of a plurality of power delivery network components, the power delivery network component of a first one of the plurality of I/O circuits being substantially different from the power delivery network component of a second one of the plurality of I/O circuits, each of the plurality of state transitions corresponding to a level of SSO noise when executed by the plurality of I/O circuits, the level of SSO noise of a first subset of the plurality of state transitions being lower than the level of SSO noise of a second subset of the plurality of state transitions; the encoder configured to: receive a requested transition of the plurality of state transitions at the plurality of encoder inputs; cause the I/O circuits to perform the requested transition and disable the status output when the requested transition is one of the first subset of the plurality of state transitions; and cause the I/O circuits to perform a converted transition different from the requested transition and enable the status output when the requested transition is one of the second subset of the plurality of state transitions, the converted transition being one of the first subset of the plurality of state transitions.

In one embodiment, the power delivery network components include bonding wires.

In one embodiment, the bonding wire of a first one of the plurality of I/O circuits is substantially longer than the bonding wire of a second one of the plurality of I/O circuits.

BRIEF DESCRIPTION OF THE DRAWINGS

These and other features and advantages of the present invention will be appreciated and understood with reference to the specification, claims and appended drawings wherein:

FIG. 3A is a table of requested transitions and encoded transitions on a two-bit bus according to an embodiment of the present invention;

FIG. 3B is a table of requested transitions and encoded transitions according to a related art embodiment;

FIG. 4 is a table of requested transitions and converted transitions on a four-bit bus according to an embodiment of the present invention.

DETAILED DESCRIPTION

The detailed description set forth below in connection with the appended drawings is intended as a description of exemplary embodiments of a bus encoding scheme based on non-uniform distribution of power delivery network components among I/O circuits provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
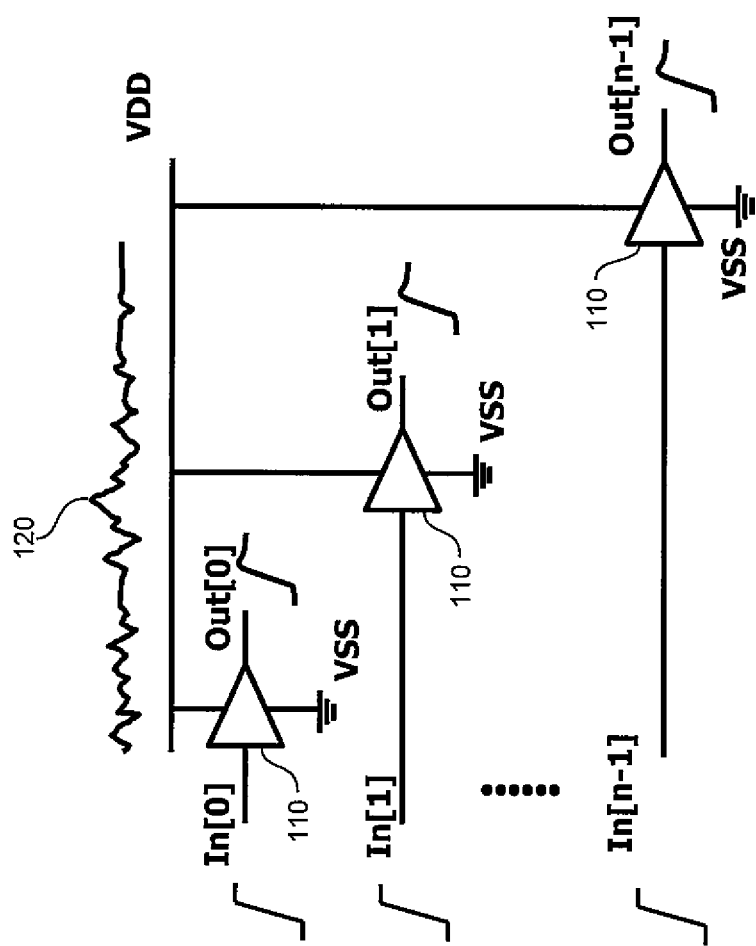
FIG. 1 is a simplified schematic diagram illustrating I/O circuits with shared power connections according to an embodiment of the present invention.

Referring to FIG. 1, in one embodiment, a plurality of I/O circuits 110 may be controlled by signals at their inputs, and may generate output signals for driving a bus. The bus may repeatedly transmit a parallel set of bits, each set of bits being present on the bus during an interval referred to as a time slot, and the boundaries between time slots, i.e., points in time at which a set of bits on the bus may be replaced with a new set of bits, being referred to as bus events. When a new set of bits replaces a previous set of bits on the bus, the change, or the difference between the new set of bits and the previous set of bits, is referred to as a transition. A set of bits on the bus may be represented by a set of zeroes and ones, such as, for a four-bit bus, "0110" or "1110". Transitions may also be represented as zeroes and ones, with a one representing a change in the corresponding bit and a zero representing no change. For example, the transition between the two bit patterns "0110" and "1110" is written "1000" in this notation because the two bit patterns differ only in the first bit. The transition between two identical bit patterns, which may occur, e.g., when the bit pattern on the bus is the same in two consecutive time slots, is referred to herein as the null transition and has (or consists of) all zeros. Given a first bit pattern and a transition it is possible to determine a second bit pattern differing from the first bit pattern by the transition; the second bit pattern may be obtained by changing the value of the first bit pattern at each position at which the transition contains a one.

SSO noise may depend on the number of I/O circuits changing state at any given time, and also on the circuit configuration. A simultaneous transition from 0 to 1 in all of the I/O circuits, for example, may produce a fluctuating VDD, notionally illustrated as waveform 120.

Figure 2:
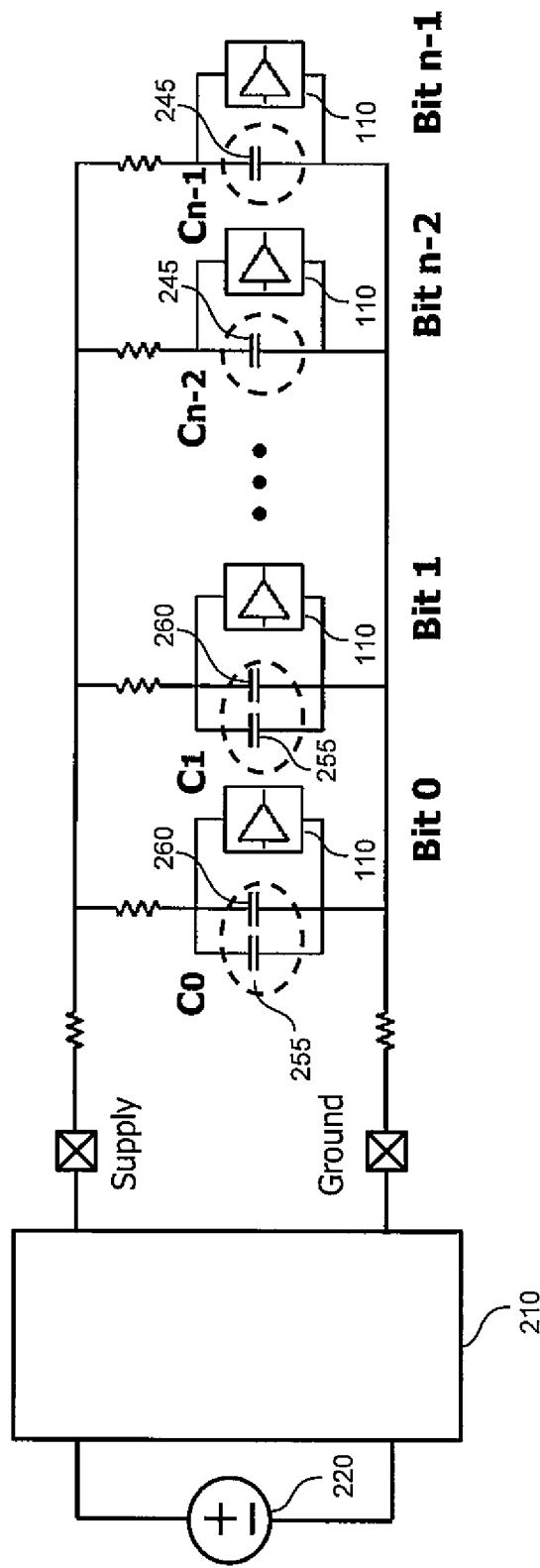
FIG. 2 is a schematic diagram illustrating I/O circuits with non-uniform power supply decoupling capacitances according to an embodiment of the present invention.

Referring to FIG. 2, the magnitude of the SSO noise may depend on a number of aspects of the circuit configuration, including off-chip components 210 which may be installed between the power supply 220 and the I/O circuits 110, and which may provide power supply filtering. In addition, power supply decoupling capacitances, such as capacitances C0, C1, Cn−2, Cn−1, may be connected across the power supply connections of the I/O circuits. Each power supply decoupling capacitance may be composed of a single capacitor e.g., each of the capacitors 245, or two or more capacitors, e.g., capacitors 255, 260, connected in parallel. Generally, the larger the value of the power supply decoupling capacitance associated with an I/O circuit, the lower the resulting SSO noise contribution from that I/O circuit.

In one embodiment, the total SSO noise is reduced by distributing the power supply decoupling capacitances non-uniformly, i.e., by associating more or larger capacitors with one I/O circuit than with another. In FIG. 2 this concept is illustrated by the use of two capacitors in the power supply decoupling capacitance associated with the Bit 0 and Bit 1 I/O circuits and the use of only one capacitor in the power supply decoupling capacitance associated with the Bit n−2 and Bit n−1 I/O circuits. In a system with a non-uniform power supply decoupling capacitance distribution of this sort, the total SSO noise may be reduced by using a bus encoding scheme which results, in some instances, in one or more of the quieter I/O circuits (i.e., those with greater power supply decoupling capacitance) making transitions instead of noisier I/O circuits (i.e., those with smaller power supply decoupling capacitance).

In a system with a non-uniform power supply decoupling capacitance distribution, numerical simulations may be used to estimate the amount of SSO noise produced by any transition, and the transitions may be categorized into two groups, referred to herein as A and B, the A group being ones producing higher SSO noise and the B group being ones producing lower SSO noise. In particular, if all of the possible transitions are ranked in order of decreasing SSO noise, the first half of the transitions form the A group, and the second half of the transitions form the B group. An encoding scheme may then be used to ensure that all transitions occurring on the bus are transitions in the B group.

Such a scheme may be implemented as follows. Referring to FIG. 3A, in an example bus with two data lines, i.e., a bus which transmits two bits simultaneously, the decoupling capacitance may be selected to be larger for the Bit 0 I/O circuit than for the Bit 1 I/O circuit, e.g., the capacitances may be 150 pF and 50 pF respectively. As a result, transitions in which the most significant bit (MSB), i.e., Bit 1, changes state may produce more SSO noise than transitions in which the MSB does not change state. For example, a simulation may predict that a transition in both bits may produce normalized SSO noise of 2.19, a transition in the MSB only may produce normalized SSO noise of 1.51, a transition in the least significant bit (LSB) only may produce normalized SSO noise of 0.68, and the null transition may produce normalized SSO noise of 0. If the data to be transmitted were transmitted without encoding, the worst case normalized SSO noise would be 2.19, as illustrated in the third column of FIG. 3A, entitled "SSO Noise (Normalized)".

In one embodiment, this worst case normalized SSO is significantly reduced by the use of encoding, resulting in the normalized SSO noise, for various transitions, shown in the fifth column of FIG. 3A, also entitled "SSO Noise (Normalized)". An encoder in the transmitter receives a requested transition, i.e., a requested set of data bits to be sent on the bus, which may or may not differ from the last bits sent. The encoder then causes the I/O circuits to perform either the requested transition, if the requested transition is in the B group, or, if the requested transition is in the A group, a converted transition, i.e., the encoder causes the I/O circuits to send the requested set of data bits, or a converted set of data bits differing from the previous set of data bits by the converted transition, where the encoding is designed so that the converted transition is in the B group.

In the example of FIG. 3A, there are four possible transitions, of which the two with higher SSO noise (shown in the third column) are in the A group, and the other two are in the B group. The two transitions in the A group, i.e., the transitions resulting in the highest normalized SSO noise, are converted to the other two transitions, and in particular the transition "11" (corresponding to a transition in both bits) is converted to the transition "00" (corresponding to the null transition, i.e., the new data bits being the same as the previous data bits), and the transition "10" is converted to the transition "01". When the encoder causes the I/O circuits to perform a converted transition, instead of the requested transition, it enables a status output, which is connected to a status input on the receiver, notifying the receiver that a converted transition was used, so that the receiver may perform an alternate transition upon receipt of the transmitted data and of the status. As a result of this encoding the worst case normalized SSO noise is 0.68, as illustrated in the fifth column of FIG. 3A.

The receiver is configured to reverse the encoding, for example by proceeding as follows. Upon receiving a new set of data bits, and a received transition, the received transition being the difference between the new set of data bits and the previous set of data bits, the receiver may either perform the requested transition at the receiver outputs or, if the status input is enabled, perform an alternate transition, the alternate transition selected to reverse the conversion performed in the encoder, i.e., to produce the requested transition at the receiver output.

By comparison, if uniform power supply decoupling capacitances were used for all of the I/O circuits, with the same total power supply decoupling capacitance, e.g., using the same PWB area for power supply decoupling capacitances, then the results of FIG. 3B may be obtained. The SSO noise of each transition may depend only on the number of bits changing state in that transition, and the normalized SSO noise of the transition "11" may be 2.0, the normalized SSO noise of the transition "10" may be 1.0, the normalized SSO noise of the transition "01" may be 1.0, and the normalized SSO noise of the transition "00" may be 0.0. Encoding may substitute a low-SSO noise transition for the "11" transition, as shown in the first row of FIG. 3B resulting in a reduction of worst case normalized SSO noise from 2.0 to 1.0, a reduction that is not as great as may be achieved using a non-uniform distribution of the power supply decoupling capacitance.

Referring to FIG. 4, in another example involving a four-bit data bus, and, correspondingly, four I/O circuits, requested transitions may be encoded to converted transitions as shown, with simulated reductions in predicted normalized SSO noise shown in the third and fifth columns respectively. Transitions having low SSO noise are not converted and are not shown in the table. In a similar embodiment, the encoding of FIG. 4 may be used except that "1010" may be encoded to "0101" instead of to "0110" and "1001" may be encoded to "0110" instead of to "0101"; in this embodiment the encoding corresponds to inverting each bit of the transition.

Figure 5:
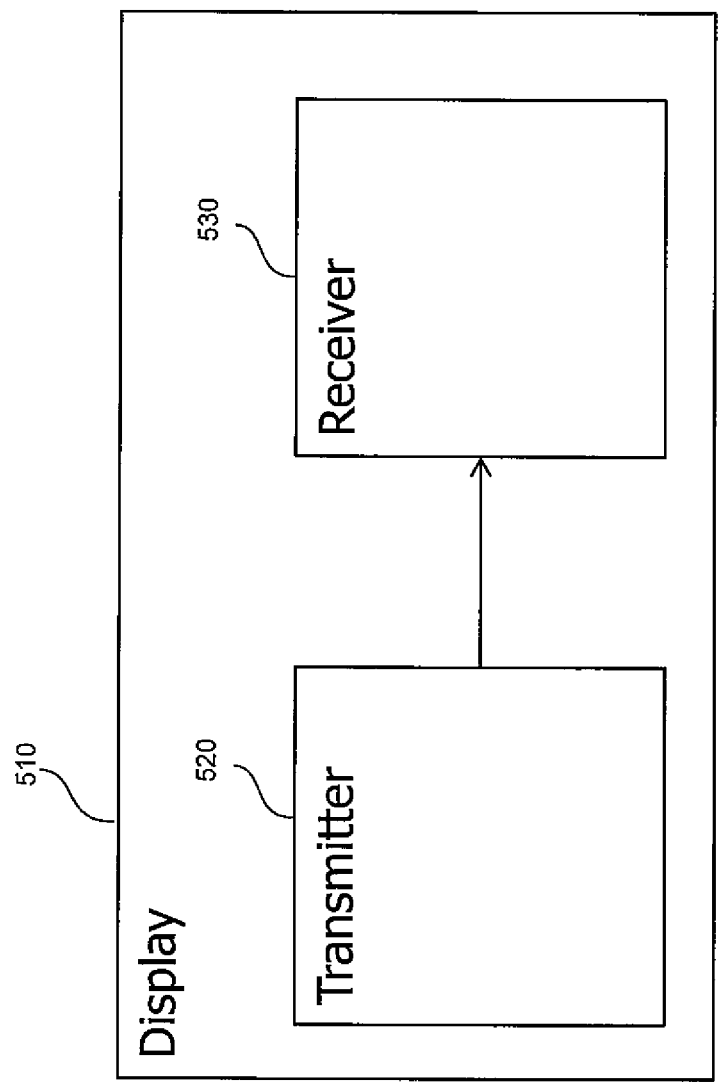
FIG. 5 is a block diagram of a display including a transmitter and receiver constructed according to an embodiment of the present invention.

Referring to FIG. 5, in one embodiment a digital display 510, such as an organic light emitting diode display or a liquid crystal display in a television or a cell phone, includes a transmitter 520 transmitting data to a receiver 530. The transmitter 520 is constructed to employ a bus encoding scheme based on non-uniform distribution of power delivery network components among I/O circuits, according to an embodiment of the present invention. Although the present invention may be employed to transmit data between components of a display, the invention is not thereby limited, and it may be used in other applications in which data is transmitted from a transmitter to a receiver.

Although exemplary embodiments of a bus encoding scheme based on non-uniform distribution of power delivery network components among I/O circuits have been specifically described and illustrated herein, many modifications and variations will be apparent to those skilled in the art. For example, types of power delivery network components other than capacitors, such as metal wires on the chip, bonding wires, and vias in the package, may also be used either in combination or alone, to introduce or increase the non-uniformity of SSO noise contribution among individual bus bits. Accordingly, it is to be understood that a bus encoding scheme based on non-uniform distribution of power delivery network components among I/O circuits constructed according to principles of this invention may be embodied other than as specifically described herein. The invention is also defined in the following claims, and equivalents thereof.

What is claimed is:

1. A system for transmitting data with reduced simultaneous switching output (SSO) noise, the system comprising:
   an encoder comprising a plurality of encoder inputs and a status output, the encoder inputs configured to operate in a plurality of input states, and to transition between the input states of the plurality of input states by a plurality of state transitions; and
   a plurality of input/output (I/O) circuits controlled by the encoder, the plurality of I/O circuits configured to operate in a plurality of I/O states, and to transition between I/O states of the plurality of I/O states by the plurality of state transitions;
   each I/O circuit of the plurality of I/O circuits associated with a power supply decoupling capacitance of a plurality of power supply decoupling capacitances, the decoupling capacitance of a first one of the plurality of I/O circuits being substantially smaller than the decoupling capacitance of a second one of the plurality of I/O circuits,
   each of the plurality of state transitions corresponding to a level of SSO noise when executed by the plurality of I/O circuits,
   the level of SSO noise of a first subset of the plurality of state transitions being lower than the level of SSO noise of a second subset of the plurality of state transitions;
   the encoder configured to:
      receive a requested transition of the plurality of state transitions at the plurality of encoder inputs;
      cause the I/O circuits to perform the requested transition and disable the status output when the requested transition is one of the first subset of the plurality of state transitions; and
      cause the I/O circuits to perform a converted transition different from the requested transition and enable the status output when the requested transition is one of the second subset of the plurality of state transitions, the converted transition being one of the first subset of the plurality of state transitions.

2. The system of claim 1, wherein the converted transition is the inverse of the requested transition.

3. The system of claim 1, wherein the encoder has 2 encoder inputs and the system has 2 I/O circuits.

4. The system of claim 1, wherein the decoupling capacitance of the first one of the plurality of I/O circuits is substantially smaller than the decoupling capacitances of the others of the plurality of I/O circuits.

5. The system of claim 4, wherein the first one of the plurality of I/O circuits corresponds to the most significant bit of a data bus.

6. The system of claim 4, wherein the first subset of the plurality of transitions comprises transitions in which the first one of the plurality of I/O circuits does not change state.

7. The system of claim 6, wherein the second subset of the plurality of transitions contains only:

the set of transitions in which the first one of the plurality of I/O circuits changes state and at least one other I/O circuit changes state, and the transition in which the first one of the plurality of I/O circuits does not change state and all of the other I/O circuits change state.

8. The system of claim 1, comprising a receiver configured to be operatively coupled to the plurality of I/O circuits, the receiver comprising:
   a plurality of receiver inputs, each of the plurality of receiver inputs corresponding to, and configured to receive a signal from, one of the plurality of I/O circuits; and
   a status input operatively coupled to the status output.

9. The system of claim 8, wherein the receiver comprises:
   a plurality of receiver outputs,
      each of the plurality of receiver outputs corresponding to one of the plurality of receiver inputs; and
   a decoder,
   the decoder configured to cause the receiver outputs to perform the requested transition when the plurality of receiver inputs receive a plurality of signals from the plurality of I/O circuits.

10. The system of claim 9, wherein the decoder is configured to:
   receive a received transition at the plurality of receiver inputs;
   receive, at the status input, an enable signal or a disable signal;
   cause the receiver outputs to perform the received transition when the status input receives a disable signal; and
   cause the receiver outputs to perform an alternate transition different from the received transition when the status input receives an enable signal, the alternate transition being selected to reverse a mapping, implemented in the encoder, from the requested transition to the converted transition.

11. A method for transmitting data in a system comprising a plurality of I/O circuits, each I/O circuit of the plurality of I/O circuits associated with a power supply decoupling capacitance, the decoupling capacitance of a first one of the plurality of I/O circuits being substantially smaller than the decoupling capacitance of a second one of the plurality of I/O circuits, the method comprising:
   receiving a requested transition corresponding to a requested change in states of the I/O circuits;
   classifying the requested transition as being a member of:
      a first subset of a plurality of possible state transitions between states of the plurality of I/O circuits; or
      a second subset of a plurality of possible state transitions between states of the plurality of I/O circuits,
   the state transitions of the first subset of the plurality of possible state transitions having a lower level of SSO noise than the state transitions of the second subset of the plurality of possible state transitions,
   causing the I/O circuits to perform the requested transition and disabling a status output when the requested transition is one of the first subset of the plurality of state transitions; and
   causing the I/O circuits to perform a converted transition different from the requested transition and enabling the status output when the requested transition is one of the second subset of the plurality of state transitions, the converted transition being one of the first subset of the plurality of state transitions.

12. The method of claim 11, wherein the converted transition is the inverse of the requested transition.

13. The method of claim 12, wherein the system has 4 I/O circuits.

14. The method of claim 11, wherein the decoupling capacitance of the first one of the plurality of I/O circuits is substantially smaller than the decoupling capacitance of the others of the plurality of I/O circuits.

15. The method of claim 14, wherein the first one of the plurality of I/O circuits corresponds to the most significant bit of a data bus.

16. The method of claim 14, wherein the second subset of the plurality of state transitions is the set of state transitions in which the first one of the plurality of I/O circuits changes state.

17. The method of claim 14, wherein the second subset of the plurality of state transitions contains only:
   the set of state transitions in which the first one of the plurality of I/O circuits changes state and at least one other I/O circuit changes state, and
   the state transition in which the first one of the plurality of I/O circuits does not change state and all of the other I/O circuits change state.

18. A system for transmitting data with reduced simultaneous switching output (SSO) noise, the system comprising:
   an encoder comprising a plurality of encoder inputs and a status output, the encoder inputs configured to operate in a plurality of input states, and to transition between the input states of the plurality of input states by a plurality of state transitions; and
   a plurality of input/output (I/O) circuits controlled by the encoder, the plurality of I/O circuits configured to operate in a plurality of I/O states, and to transition between I/O states of the plurality of I/O states by the plurality of state transitions;
   each I/O circuit of the plurality of I/O circuits associated with a power delivery network component of a plurality of power delivery network components, the power delivery network component of a first one of the plurality of I/O circuits being substantially different from the power delivery network component of a second one of the plurality of I/O circuits,
   each of the plurality of state transitions corresponding to a level of SSO noise when executed by the plurality of I/O circuits,
   the level of SSO noise of a first subset of the plurality of state transitions being lower than the level of SSO noise of a second subset of the plurality of state transitions;
   the encoder configured to:
      receive a requested transition of the plurality of state transitions at the plurality of encoder inputs;
      cause the I/O circuits to perform the requested transition and disable the status output when the requested transition is one of the first subset of the plurality of state transitions; and
      cause the I/O circuits to perform a converted transition different from the requested transition and enable the status output when the requested transition is one of the second subset of the plurality of state transitions, the converted transition being one of the first subset of the plurality of state transitions.

19. The system of claim 18, wherein the power delivery network components comprise bonding wires.

20. The system of claim 19, wherein the bonding wire of a first one of the plurality of I/O circuits is substantially longer than the bonding wire of a second one of the plurality of I/O circuits.

* * * * *